(12) United States Patent
Maillart et al.

(10) Patent No.: US 8,669,630 B2
(45) Date of Patent: Mar. 11, 2014

(54) DETECTION MATRIX WITH IMPROVED BIASING CONDITIONS AND FABRICATION METHOD

(75) Inventors: Patrick Maillart, La Murette (FR); Fabien Chabuel, Echirolles (FR)

(73) Assignee: Societe francaise de detecteurs infrarouges—SOFRADIR, Chatenay Malabry (FR)

( * ) Notice: Subject to any disclaimer, the term of this patent is extended or adjusted under 35 U.S.C. 154(b) by 21 days.

(21) Appl. No.: 13/410,937

(22) Filed: Mar. 2, 2012

(65) Prior Publication Data

US 2012/0223404 A1 Sep. 6, 2012

(30) Foreign Application Priority Data

Mar. 4, 2011 (FR) ...................... 11 00661
Mar. 4, 2011 (FR) ...................... 11 00663

(51) Int. Cl.
*H01L 31/0203* (2006.01)

(52) U.S. Cl.
USPC ...................................... 257/433

(58) Field of Classification Search
USPC ......... 257/225, 228, 433, 443, 445, 457, 458, 257/459, 461; 438/57, 66; 250/332
See application file for complete search history.

(56) References Cited

U.S. PATENT DOCUMENTS

| | | | |
|---|---|---|---|
| 6,188,070 B1 | 2/2001 | Destefanis et al. | |
| 7,148,551 B2 * | 12/2006 | Yoneta et al. | 257/443 |
| 2001/0012133 A1 | 8/2001 | Yoneda et al. | |
| 2009/0045395 A1 | 2/2009 | Kim et al. | |

FOREIGN PATENT DOCUMENTS

| | | |
|---|---|---|
| EP | 1 530 239 A2 | 5/2005 |
| EP | 1 677 353 A1 | 7/2006 |
| EP | 2 237 317 A1 | 10/2010 |
| WO | WO 98/15016 A1 | 4/1998 |
| WO | WO 2006/005803 A1 | 1/2006 |

* cited by examiner

*Primary Examiner* — Shaun Campbell
(74) *Attorney, Agent, or Firm* — Oliff PLC

(57) ABSTRACT

The detection device includes a semiconductor substrate of a first conductivity type. A matrix of photodiodes organized along a first organization axis is formed on the substrate. Each photodiode is at least partially formed in the substrate. A peripheral biasing ring is formed around the photodiode matrix. The biasing ring is connected to a bias voltage generator. An electrically conducting contact is connected to the substrate and arranged between two photodiodes on the first organization axis. The distance separating the contact from each of the two photodiodes is equal to the distance separating two adjacent photodiodes along the first organization axis. The contact is connected to the bias voltage generator.

6 Claims, 2 Drawing Sheets

DETECTION MATRIX WITH IMPROVED BIASING CONDITIONS AND FABRICATION METHOD

BACKGROUND OF THE INVENTION

The invention relates to an electromagnetic radiation detection device comprising a matrix of photodetectors arranged on a substrate and to a fabrication method thereof.

STATE OF THE ART

In the field of detection devices, there is commonly a photodetector associated with a readout circuit. The photodetector delivers a signal representative of the observed scene and this signal is analyzed by the readout circuit.

Biasing of the photodetector is obtained by means of the substrate potential imposed on a first terminal of the photodetector and by means of a reference potential imposed on the second terminal of the photodetector, by a readout device of capacitive transimpedance amplifier type.

In order to obtain an ever-increasing amount of information on the observed scene, the photodetector has given way to a plurality of photodetectors. There is furthermore a constant increase of the number of photodetectors integrated in a detection circuit in order to enhance the definition of the detector. Integrating a large number of photodetectors does however give rise to difficulties of fabrication and operation.

In order to keep a reasonable collection surface and a small size of the device, the plurality of photodetectors are integrated in the form of a matrix. An electrically conducting biasing ring surrounds the matrix to impose the substrate potential on the matrix. There are then a large number of photodetectors organized in a matrix and all the photodetectors are connected in more or less direct manner to the substrate potential.

This organization results in an undeniable gain as far as integration density is concerned, but it gives rise to difficulty in biasing the different photodetectors.

The photodiodes are generally reverse-biased so as to deliver a current representative of the observed scene. The photodiode then acts as a current generator. The photodiode bias is applied on one side by the substrate and on the other side by the readout circuit. Under these operating conditions, electric modelling of a photodiode of the matrix can be represented by a dynamic resistor connected in parallel with the current generator and a series resistor connected in series with the assembly.

It is then observed that the series resistor of the photodiode can cause a modification of the bias at its terminals. According to the current intensity generated by the current source, the potential at the terminals of the photodiode can in fact vary. Furthermore, organization of the different photodiodes in a matrix means that these variations of potentials can cumulate and result in depolarization of one or more photodiodes situated in the central part of the matrix.

As the essential depolarization component is resistive, this risk of depolarization is all the more marked the higher the current generated by the photodetector. It can also be noted that this phenomenon is greater the larger the photodetector matrix and the higher the resistance value.

A risk then exists of having at least one photodetector which is no longer working in its optimum operating range. This then results in problems of linearity between the current supplied by the photodetector and the incident flux. This kind of problem is difficult or impossible to correct by image correction devices applied to the whole of the matrix.

A restraint therefore exists on integration of matrices of large dimensions and/or matrices working with high currents.

One solution has been provided by the document WO9815016A1 which modifies the substrate by integrating a highly doped area under the photodetectors. This highly doped area promotes transport of the charge carriers by reducing the resistivity of the substrate. However this modification of the substrate involves a cost and cannot be performed with usual growth techniques. This solution is therefore not able to be easily integrated.

OBJECT OF THE INVENTION

It is observed that a requirement exists to provide a detection device which presents a more rugged operation.

This requirement tends to be satisfied by means of a device which comprises:
a semiconductor substrate of a first conductivity type,
a matrix of photodiodes organized along a first organization axis with a repetition pitch, each photodiodes comprising a first electrode formed by an area of a second conductivity type opposite from the first conductivity type and a second electrode formed by the semiconductor substrate,
a peripheral biasing ring around the photodiode matrix, the biasing ring being connected to a bias voltage generator to apply a bias voltage to the semiconductor substrate,
a contact arranged between two photodiodes in the alignment of the first organization axis, the contact being separated from the two photodiodes along the first organization axis by the repetition pitch so that the contact replaces a photodiode, the contact comprising:
  a conducting bump arranged on the semiconductor substrate and connected to the bias voltage generator to apply the bias voltage to the substrate,
  a first area of first conductivity type configured to perform passage of the charges between the conducting bump and semiconductor substrate,
a second area of second conductivity type arranged to be in contact with the conducting bump.

It is observed that a requirement exists to provide a method for fabricating such a device in simple manner.

This requirement tends to be satisfied by means of a method which comprises:
providing a semiconductor substrate of a first conductivity type,
forming a matrix of areas of second conductivity type organized along a first organization axis, the areas of second conductivity type being separated by a constant repetition pitch along the first organization axis, the second conductivity type being the opposite of the first conductivity type,
forming an area of first conductivity type so as to connect the semiconductor substrate and to enable passage of the charges between the substrate and the area of first conductivity type, the area of first conductivity type being aligned with the areas of second conductivity type,
forming an electrically conducting bump electrically connected with the areas of second conductivity type and an electrically conducting bump having an interface with the area of first conductivity type.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

Figure 1:
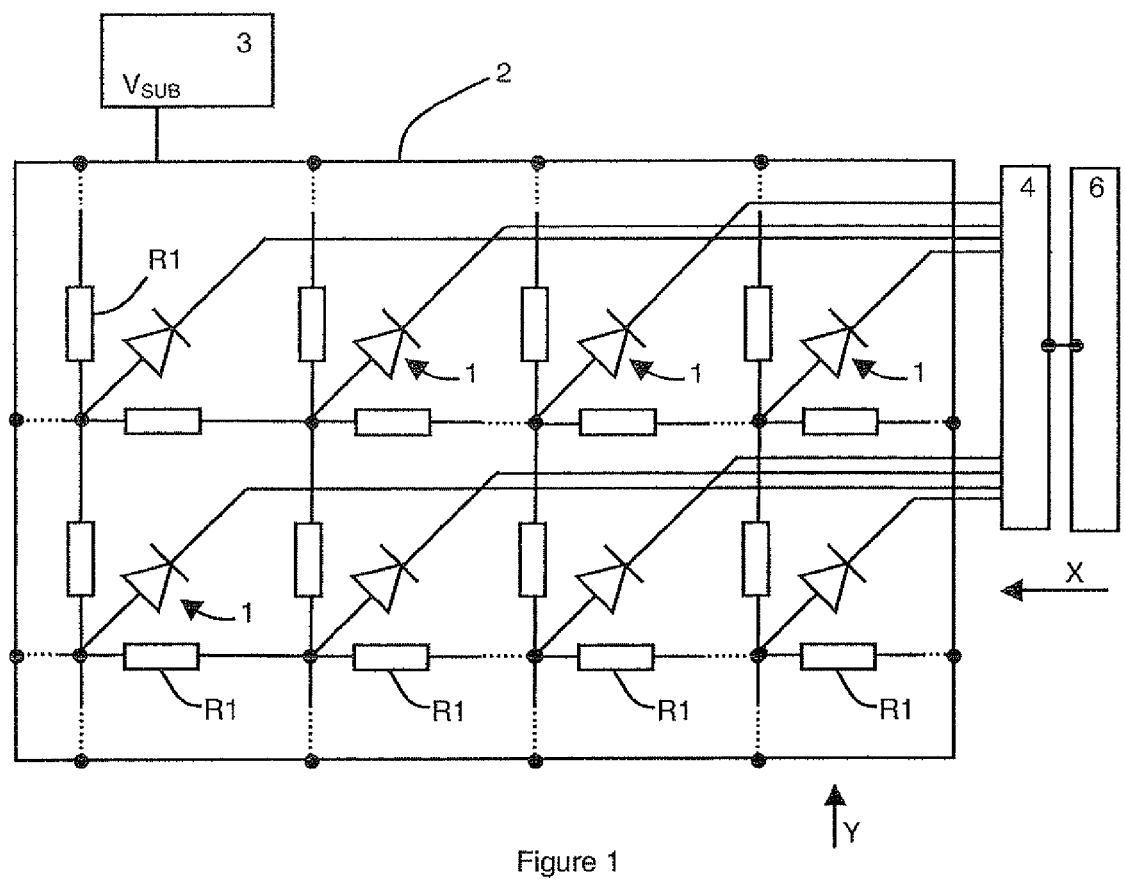
FIGS. 1 and 2 represent matrices of photodetectors of a detection device, in schematic manner.
Figure 2:
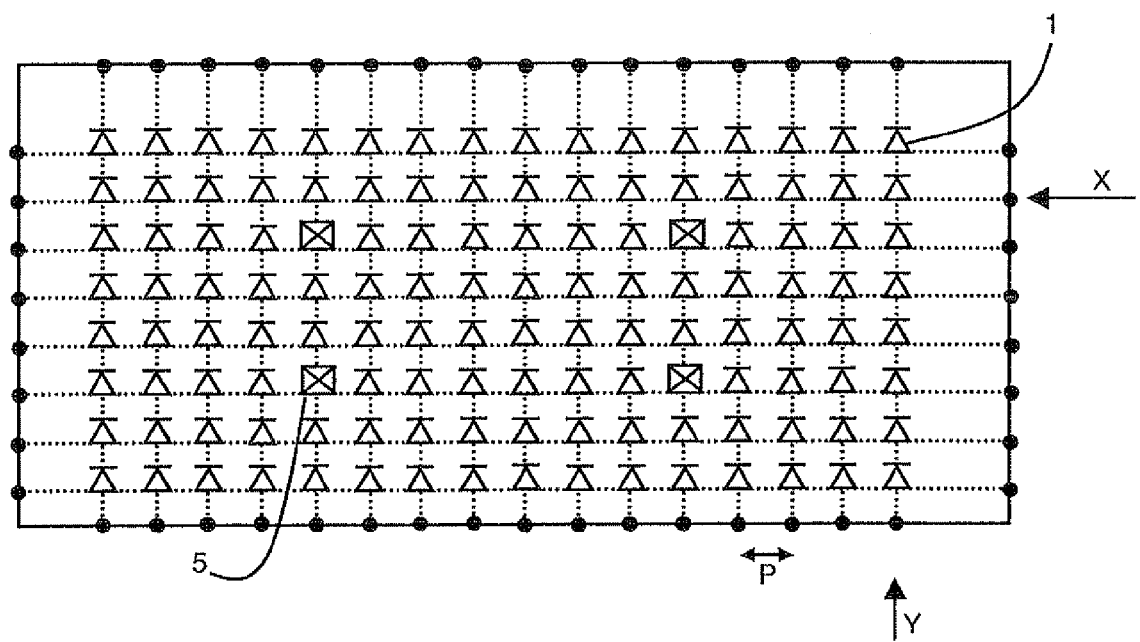

As illustrated in FIGS. 1 and 2, the detection device comprises a plurality of photodetectors 1 which are organized in a matrix. Photodetectors 1 are organized along a first organization axis X, i.e. photodetectors 1 form a row or a column along this first axis X. The photodetectors are organized along axis X with a repetition pitch P.

In an illustrated preferred embodiment, the plurality of photodetectors 1 are also organized along a second organization axis Y which is secant to first organization axis X. For example purposes, first organization axis X is perpendicular to second organization axis Y. In this way, photodetectors 1 are organized with respect to one another in two different directions represented by the first and second organization axes.

In this way, photodetectors 1 are aligned with one another along one or more lines parallel to axis X and may be aligned along one or more lines parallel to axis Y. Photodetectors 1 are then organized in rows and in columns.

Photodetector matrix 1 is formed on a substrate made from semiconductor material and is surrounded by a peripheral biasing line 2. Line 2 is a line made from electrically conducting material, for example a metallic line which runs on the surface of the substrate. In other embodiments, line 2 is a doped area of the substrate, this area being more highly doped than the rest of the substrate so as to reduce the potential drop along the line. In preferred manner, line 2 is a doped area which is of the same conductivity type as the substrate. The substrate is of a first conductivity type, for example P-conductivity.

Peripheral biasing line 2 is connected to a bias voltage generator 3. Bias voltage $V_{SUB}$ or a voltage close to the latter is applied to photodetectors 1 via biasing line 2 and the substrate. Bias voltage $V_{SUB}$ partly fixes the biasing conditions of photodetectors 1 by applying a first potential on a first electrode of photodetector 1. Bias voltage $V_{SUB}$ or a voltage resulting from the latter is applied on the first electrode of the different photodetectors 1. A second voltage, a reference voltage, is applied on a second electrode of the photodetectors in order to fix the biasing conditions of the different photodetectors 1. In advantageous manner, the photodetectors are reverse-biased between bias voltage $V_{SUB}$ and the reference voltage.

Figure 3:
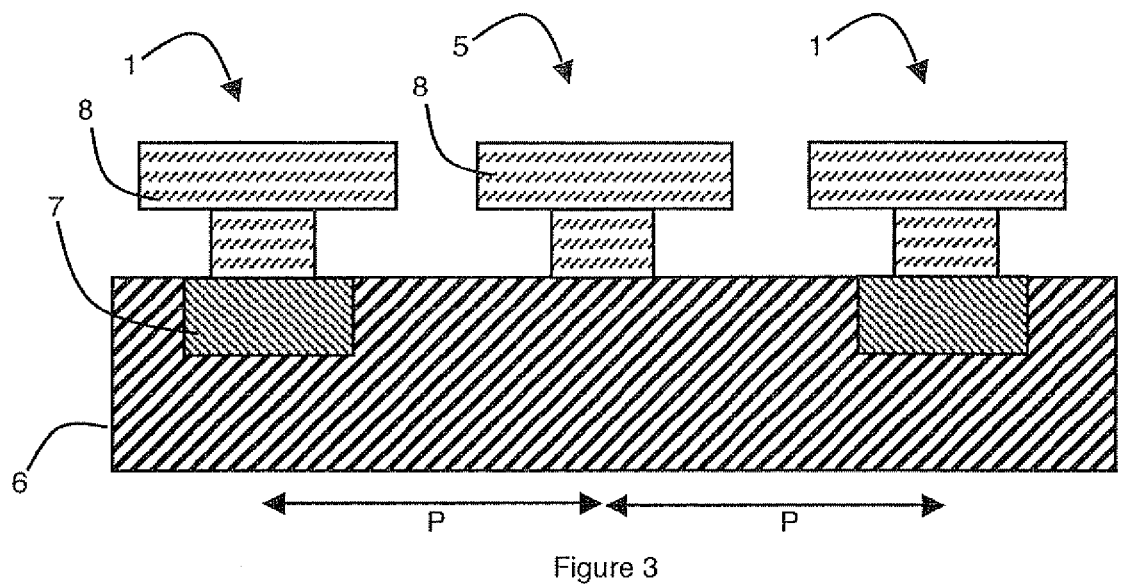
FIG. 3 represents several photodetectors and a contact along one of the organization axes, in schematic manner in cross-section.
Figure 4:
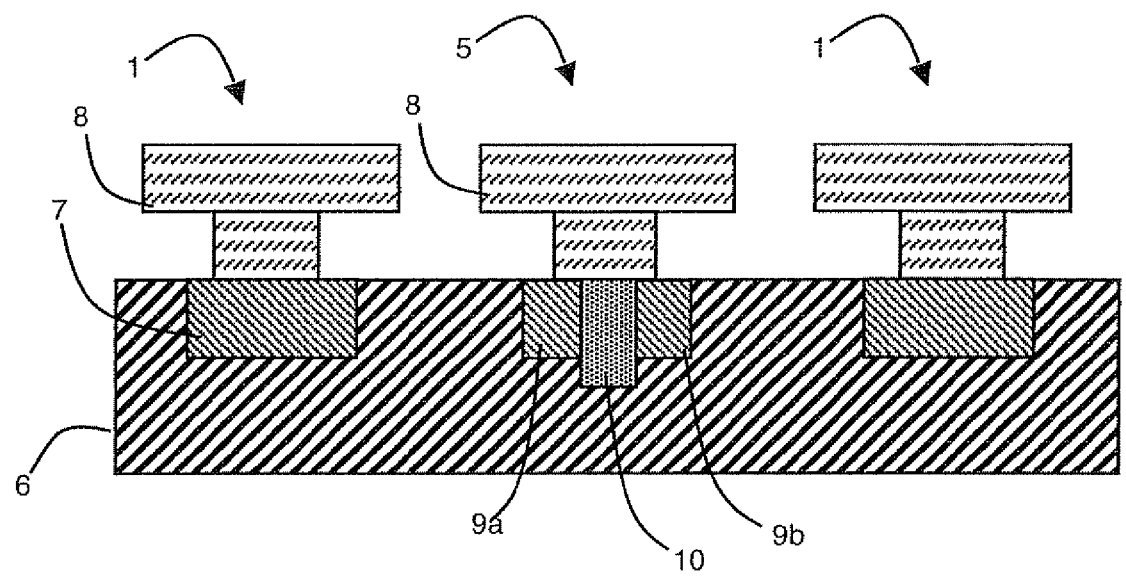
FIG. 4 represents an alternative embodiment of several photodetectors and of a contact along one of the organization axes, in schematic manner in cross-section.

In a preferred embodiment illustrated in FIG. 3, each photodetector 1 is at least partially formed by a part of semiconducting substrate 1. For example, the first electrode is formed by substrate 1 which facilitates integration of the matrix in the substrate and limits bias excursions. In an even more privileged embodiment, the photodetectors are formed in the substrate. The photodetector is a photodiode of PN or NP type the first electrode of which is formed by substrate 6, a first area of first conductivity type, and the second electrode of which is a second area 7 of second conductivity type formed in the substrate.

For example purposes, each photodetector 1 is associated with a readout circuit which imposes a reference voltage on the second electrode of photodetectors 1. In FIG. 1, the different readout circuits are grouped together to form readout means or a readout device 4 which comprises a matrix of readout circuits. Each readout circuit is associated with one or more photodetectors 1 and recovers the emitted electric signal. In an alternative embodiment, reading the electric information emitted by photodetectors 1 and biasing the photodetectors are two dissociated functions and it is possible to associate a photo-detector 1 with a readout circuit and with a biasing device.

In operation, the substrate is not always able to perform transportation of the charge carriers emitted by the different photodetectors 1 to bias line 2, which results in a modification of the biasing conditions of certain photodetectors 1 from the substrate.

As illustrated in FIG. 2, the device also comprises one or more electrically conducting pin-point contacts 5 which are connected on the one hand to the substrate and on the other hand to bias voltage generator 3. Electrically conducting contacts 5 are formed in photodetector matrix 1 instead of a photodetector 1. Contact 5 comprises means for applying bias voltage $V_{SUB}$ to the substrate.

Contact 5 couples bias voltage generator 3 with an area of first conductivity type of the substrate. It comprises an electrically conducting bump 8 which has an interface with an area of first conductivity type of the substrate so as to apply bias voltage $V_{SUB}$ directly to the substrate and to photodetector matrix 1. Contacts 5 act as direct contacts between the substrate, an area of first conductivity type, and bias voltage generator 3.

In this way, contacts 5 are the relay of bias line 2 within photodetector matrix 1. Contacts 5 reduce the distance that has to be covered by a charge emitted by photodetectors 1 to reach bias voltage $V_{SUB}$ and be ejected from the substrate.

As illustrated in FIG. 3 in cross-section, contact 5 is substantially identical to a photodetector 1. Contact 5 and photodetector 1 each comprise an electrically conducting bump 8. In the case where photodetector 1 is a PN or NP diode, this bump 8 is deposited on the substrate as for contact 5.

In the case of the photodetector, one end of bump 8 is coupled to the readout circuit. The other end of bump 8 is deposited on an area of second conductivity type of the substrate which enables photodetector 1, here the diode, to be biased.

In the case of contact 5, one end of bump 8 is coupled to bias voltage generator 3. The other end of bump 8 is deposited on area 6 of first conductivity type of the substrate which enables bias voltage $V_{SUB}$ to be applied directly on the substrate and not on a diode.

As the architectures of contact 5 and of photodetector 1 are similar, common fabrication steps can be used in order to facilitate implementation and keep a high integration density.

In a particular embodiment, contact 5 can be fabricated by protecting this part of the substrate when the area of second conductivity type is formed. In this way, the substrate comprises several areas 7 of second conductivity type which will serve the purpose of forming photodetectors 1 and an area devoid of this doping which will serve the purpose of forming contact 5.

This technological step enables a matrix of areas 7 of second conductivity type organized along a first alignment axis X and an area of first conductivity type to be formed. The area of first conductivity type is aligned with areas 7 of second conductivity type. The distance separating the area of first conductivity type from the two closest neighbouring areas of second conductivity type is equal to the repetition pitch that exists between two consecutive areas of second conductivity type. The repetition pitch is that of the photodetectors in the matrix.

A common step of formation of bumps 8 is then performed without taking account of the fact that bump 8 can be formed for a contact 5 or for a photodetector 1. For example purposes, bumps 8 have identical lateral dimensions (length and width) and they can be formed by the same material. Bump 8 of electrically conducting material is formed on the areas of second conductivity type and the area of first conductivity type.

As electrically conducting contact 5 is formed instead of a photodetector 1, contact 5 is aligned along first organization axis X with the other photodetectors 1 of the same column or of the same row. A contact 5 has two photodetectors 1 as closest neighbours on first organization axis X. The distance separating contact 5 from these two closest neighbouring photodetectors 1 is equal to the distance separating two adjacent photodetectors 1 along first organization axis X. There is a repetition pitch P that is constant along the first organization axis, this repetition pitch P separating two consecutive elements, either two photodetectors 1 or a photodetector 1 and an electrically conducting contact 5.

In a particular embodiment, two contacts 5 are adjacent and consecutive in one of the organization directions. This embodiment is less interesting than two contacts 5 separated by several photodetectors.

Contact 5 is perfectly integrated in the photodetector matrix, and its dimensions are identical to that of a photodetector.

In preferred manner, if several contacts 5 are formed in photodetector matrix 1, contacts 5 are located at regular intervals along first organization axis X. The distance separating two contacts 5 is an integer which is a multiple of repetition pitch P of the matrix along this first axis X which can define a first repetition pitch specific to contacts 5. The repetition distance is chosen such as to prevent the biasing conditions of photodetectors 1 from being modified beyond a threshold value.

The repetition distance of contacts 5 can therefore be defined right from the dimensioning phase of the device according to the biasing conditions applied, to the maximum applicable illumination conditions and to the electric properties of the substrate.

As electrically conducting contact 5 is formed instead of a photodetector 1, there is no integration of an additional element in the matrix. This solution can therefore be integrated in matrices where the repetition pitch is small, for example for a repetition pitch P smaller than 30 μm and in even more advantageous manner for a repetition pitch P smaller than or equal to 15 μm.

The use of an electrically conducting contact 5 or of several electrically conducting contacts 5 in photodetector matrix 1 makes the device more rugged against risks of depolarization, for example when the device is subjected to a large luminous flux.

As a photodetector 1 is replaced by an electrically conducting contact 5, a detection area exists that does not deliver any information on the observed scene. This area devoid of information corresponds to an isolated pixel. This absence of information can be compensated by a processing device using the information given by its immediate neighbours. This type of correction is not possible or able to be easily performed when a biasing sub-line is used and sacrifices a whole column or row of photodetectors 1.

Thus, in an advantageous embodiment, the device comprises means for a generator of an illumination signal from photodetectors 1 adjacent to contact 5. Depending on the embodiments, between four and eight adjacent photodetectors can be used to generate a signal originating artificially from contact 5. In this way, the device transmits a signal (for example an image) representative of the observed scene eliminating the shadow areas created by contact or contacts 5.

In the detection matrix, the hole can be assimilated to a defective photodetector having a position that is known in advance, which facilitates management of corrections to be made to have information associated with each coordinate of the matrix whether this area be occupied by a photodetector or by a bump.

Photodetectors 1 are connected to a first line made from metallic material which recovers the information supplied by the matrix. The first metallic material line couples photodetector 1 to readout circuit 4. Readout circuit 4 stores the information delivered by the photodetector and it can also be used for biasing of photodetector 1. Each photodetector provides an electric signal (a voltage or a current) which is representative of the observed scene. This signal is conveyed by an electric line to processing means of the information via readout circuit 4. Different types of readout circuit are possible, for example direct injection (DI), buffered direct injection (BDI) or capacitive trans-impedance amplifier (CTIA) circuits.

Electrically conducting contact 5 is also connected to a second metallic line and this second metallic line is coupled to bias voltage generator 3. The second metallic line is identical to the first metallic line. The two metallic lines are formed from the same material with possibly the same dimensions.

In this embodiment, bias voltage $V_{SUB}$ is applied to the substrate within photodetector matrix 1 using metallic interconnection levels, i.e. without having to provide new biasing lines between photodetectors 1. In this architecture, the biasing conditions applied on the metallic line coupled to contact 5 have a reduced impact on the photodetectors.

The use of an electrically conducting contact 5 coupled to bias voltage generator 3 is particularly interesting when substrate 6 presents a high resistivity compared with the illumination conditions accepted by the photodetectors. For example, it is advantageous to use one or more electrically conducting contacts when the substrate is P-doped as conduction of the charge carriers is less good than for N-doped substrates. This architecture enables avalanche photodiodes to be formed in the matrix or next to the matrix, which is not possible if the doping types are reversed. These embodiments are particularly interesting in the case where the substrate is a CdHgTe-based material having electric characteristics which may be insufficient to integrate matrices of large size.

The use of an electrically conducting contact 5 coupled to bias voltage generator 3 is particularly interesting when the photodetector matrix is of large size.

The use of an electrically conducting contact 5 coupled to the bias voltage generator is particularly interesting when photodetectors 1 are associated with the large wavelength regions of the infrared spectrum (8-15 μm) which results in management of a large quantity of charge carriers in the substrate.

In comparison with a conventional biasing ring which would break the matrix down into a plurality of sub-matrices, the electrically conducting contact prevents a whole column or row of photodetectors from being lost. In this case, the matrix obtained is more compact, i.e. it comprises a larger number of photodetectors per surface unit.

Photodetector matrix 1 can comprise several rows of photodetectors and/or several columns of photodetectors. Electrically conducting contacts 5 can be formed on a plurality of different rows or columns. Any one row or any one column of photodetector can thus comprise several electrically conducting contacts 5. In another embodiment, any one row or any one column does not comprise more than one contact 5 in order to reduce the impact of the contact on the information supplied by the row and/or column and therefore to reduce the impact on information processing.

In a particular embodiment, photodetector matrix 1 can comprise different organizations of photodetectors 1, for example an offset of the photodetectors present on two successive lines or two successive columns can exist in order to gain compactness. The first and second organization directions are not necessarily perpendicular.

This architecture is particularly interesting in the case of a bispectral matrix where two types of photodetectors are integrated. Each type of photodetector reacts with a particular wavelength. For this type of device, the substrate comprises several layers which react to different wavelengths, which makes the highly doped layer divulged in the document WO9815016A1 difficult to use. The two types of photodiode can have different sizes and/or different influences on the electric properties of the substrate.

In the case where the photodetectors are PN-conductivity or NP-conductivity diodes, there are two areas with opposite conductivity types which have a common interface.

In advantageous manner, substrate 6 is of the first conductivity type and areas 7 of a second conductivity type are formed within the substrate. In order to have a plurality of independent diodes, areas 7 of second conductivity type are placed at a distance from one another.

Each diode however presents a generated carrier collection surface which is larger than the surface occupied by area 7 of second conductivity type. In other words, the carriers generated outside the diode can be attracted and collected by the diode. In other words, in top view, the carrier collection surface overspills from the surface of second conductivity type.

In a particular embodiment, in order to have maximum collection of the light energy emitted by the observed scene, there is an overlap of the collection areas between two adjacent photodetectors 1. In this overlap area common to two photodetectors, the generated charge carriers have the possibility of being captured by one or the other of photodetectors 1.

In advantageous manner, photodetectors 1 have identical architectures and identical biasing conditions to facilitate processing of the information emitted by each photodetector 1 in comparison with the other photodetectors 1 of the matrix. In this case, photodetectors 1 are considered as being identical both in their architecture and in their operation. Photodetectors 1 have the same effective collection surface.

In the case where contact 5 comprises a bump 8 deposited on an area of first conductivity type and not comprising an area of second conductivity type, there is no formation of a diode or of a collection area. Photodetectors 1 adjacent to a contact 5 do not have an overlap area with contact 5 and they then have an effective collection surface that is larger than the other photodetectors. A shift exists in operation of these photodetectors 1 linked to the charge collection area which is larger than those of the other photodetectors of the matrix.

This singularity of operation makes information processing more difficult by artificially creating more luminous areas than in reality. This effect is all the more marked the larger the overlap area in the carrier charge collection surface.

In order to make the photodetectors more homogeneous with the rest of the population of the matrix, electrically conducting contact 5 advantageously comprises a doped area 9a,9b of second conductivity type of annular shape with, in its centre, the substrate and/or a doped area 10 of first conductivity type which is in electric continuity with the substrate. In this way, electrically conducting contact 5 comprises a central area of first conductivity type and a peripheral area of second conductivity type. Area 9a,9b of second conductivity type does not completely surround the area of first conductivity type so that bias voltage $V_{SUB}$ can be applied directly to the substrate and not via a diode.

This doped area 9a,9b of second conductivity type simulates operation of a photodiode with a collection surface and creates an overlap area between contact 5 and each of the adjacent photodetectors 1. This overlap area reduces the effective collection surface of photodetectors 1.

Bump 8 is in electric contact with area 10 of first conductivity type and with area 9a,9b of second conductivity type. Area 10 can be a part of the substrate or a part of area 9a,9b that has been subsequently doped with an opposite type in order to change conductivity.

In a preferred embodiment, the distance separating the outside edge of doped area 9a 9b of second conductivity type of annular shape and doped area 7 of second conductivity type of photodetector 1 is identical to the distance separating two doped areas 7 of second conductivity type of two adjacent photodetectors along the first organization axis. The central area and the peripheral area of contact 5 have opposite conductivity types and these two areas are short-circuited by means of an electrically conducting material, for example a metal, in preferred manner by bump 8 connected to generator 3.

This architecture prevents formation of a diode between the central area and the peripheral area of contact 5 which is detrimental to satisfactory operation of contact 5. This also enables peripheral area 9a,9b to be used to reduce the collection surface of adjacent photodetectors while at same time performing biasing of the substrate at bias voltage $V_{SUB}$ by means of the central part of bump 5.

In a particular embodiment, the central part of contact 5, i.e. area 10, in the substrate presents a higher dopant concentration than that of the rest of substrate 6.

This particular architecture can be achieved simply by forming the matrix of PN or NP diodes in the substrate. Areas 7 of photodiodes and area 9a,9b are formed during the same technological step, although it can also be envisaged to form them separately. A doped area 10 of first conductivity type is then formed in area 9a,9b of second conductivity type so as to make a direct connection between area 9a,9b of first conductivity type and bump 8 of contact 5. It is also possible to change the order of formation of the areas, for example to form area 10 first and to then form area 7 and area 9a,9b.

Finally, bumps 8 are formed in conventional manner like the rest of the method for implementation of the device. The bumps are for example metal balls which serve the purpose of performing interconnection with a second substrate which comprises readout module. Only the routing of the metal lines is slightly modified in order to connect contact 5 to bias voltage generator 3. The bumps are preferably arranged with a constant repetition pitch, the repetition pitch of the photodetectors.

This additional step enables a photodetector of PN or NP diode type to be transformed in simple and economic manner into a biasing contact directly integrated within the matrix.

In general manner, contact 5 comprises an area 10 of first conductivity type and an area 9a,9b of second conductivity type. These two areas are adjacent and short-circuited in order to be biased to the same potential, here bias potential $V_{SUB}$. First area 10 of first conductivity type is in doping continuity with the rest of substrate 6. In this way, first area 10 cannot be formed and completely delineated in a well of the second conductivity type. The conductivity type is constant from first area 10 up to the substrate. Second area 9a,9b can partially or completely surround first area 10 from a lateral point of view in order to have an effect on one or more collection surfaces of the adjacent areas. Several areas distinct from one another, here areas 9a and 9b, can be formed facing one or more photodetectors to modify the overlap area.

The detector comprises means for applying the bias voltage directly on an area of first conductivity type which is in doping continuity with the substrate and on an area of second conductivity type. This enables formation of a diode having a lateral influence which will reduce the collection surface of at least one adjacent photodetector.

The invention claimed is:

1. A detection device comprising:
   a semiconductor substrate of a first conductivity type,
   a matrix of photodiodes organized along a first organization axis with a repetition pitch, each photodiodes comprising a first electrode formed by an area of a second conductivity type opposite from the first conductivity type and a second electrode formed by the semiconductor substrate,
   a peripheral biasing ring disposed around the photodiode matrix, and connected to a bias voltage generator to apply a bias voltage to the semiconductor substrate,
   a contact arranged between two photodiodes in the alignment of the first organization axis, the contact being separated from the two photodiodes along the first organization axis by the repetition pitch so that the contact replaces a photodiode,
   wherein the contact comprises:
   a conducting bump arranged on the semiconductor substrate and connected to the bias voltage generator to apply the bias voltage to the substrate,
   a first area of first conductivity type configured to perform passage of the charges between the conducting bump and semiconductor substrate,
   a second area of second conductivity type arranged to be in contact with the conducting bump.

2. The device according to claim 1, wherein the electrically conducting bump short-circuits the first area and second area.

3. The device according to claim 1, wherein the second area forms a ring around the first area.

4. The device according to claim 1, comprising a plurality of electrically conducting contacts connected to the semiconductor substrate along the first organization axis, the contacts being arranged between the photodiodes at regular intervals with a first repetition pitch which is a multiple of the repetition pitch of the photodiodes.

5. The device according to claim 4, wherein the photodetector matrix is organized along a second organization axis, the contacts being arranged along the second organization axis with a second repetition pitch.

6. The device according to claim 1, wherein a first metal line couples the photodiode to a readout circuit and a second metal line connects the contact to the bias voltage generator.

* * * * *